*(12)* United States Patent
Dieny et al.

(10) Patent No.: US 7,480,175 B2
(45) Date of Patent: Jan. 20, 2009

(54) MAGNETIC TUNNEL JUNCTION DEVICE AND WRITING/READING FOR SAID DEVICE

(75) Inventors: Bernard Dieny, Lans en Vercors (FR); Ricardo Sousa, Grenoble (FR); Dana Stanescu, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 11/780,402

(22) Filed: Jul. 19, 2007

(65) Prior Publication Data

US 2007/0263434 A1     Nov. 15, 2007

Related U.S. Application Data

(63) Continuation of application No. 10/572,906, filed as application No. PCT/FR2004/002517 on Oct. 6, 2004, now abandoned.

(30) Foreign Application Priority Data

Oct. 10, 2003  (FR)  ................................. 03 11897

(51) Int. Cl.
    *G11C 11/15*      (2006.01)
(52) U.S. Cl. .................. 365/171; 365/158; 365/173
(58) Field of Classification Search .............. 365/8, 365/33
    See application file for complete search history.

(56) References Cited

U.S. PATENT DOCUMENTS

| 5,933,365 | A  | 8/1999 | Klersy et al.  |
| 6,072,718 | A  | 6/2000 | Abraham et al. |
| 6,385,082 | B1 | 5/2002 | Abraham et al. |
| 6,519,179 | B2 | 2/2003 | Minakata et al.|
| 6,535,416 | B1 | 3/2003 | Daughton et al.|
| 6,603,678 | B2 | 8/2003 | Nickel et al.  |

(Continued)

FOREIGN PATENT DOCUMENTS

FR         2 829 867        3/2003

(Continued)

OTHER PUBLICATIONS

Boulouz et al; "Preparation and characterization of MOCVD bismuth telluride thin films"; Journal of Crystal Growth; vol. 194, 1998, XP000669099; pp. 336-341.

(Continued)

*Primary Examiner*—Tan T. Nguyen
(74) *Attorney, Agent, or Firm*—Brinks Hofer Gilson & Lione

(57)  ABSTRACT

The device successively comprises a first electrode (12), a magnetic reference layer (1), a tunnel barrier (3), a magnetic storage layer (4) and a second electrode (13). At least one first thermal barrier is arranged between the storage layer (4) and the second electrode (13) and is formed by a material having a thermal conductivity lower than 5W/m/° C. A second thermal barrier can be formed by a layer arranged between the first electrode (12) and the reference layer (1). A write phase of the method comprises flow of an electric current (I1), through the tunnel junction, from the storage layer (4) to the reference layer (1), whereas a read phase comprises flow of an electric current (I2) in the opposite direction.

24 Claims, 5 Drawing Sheets

U.S. PATENT DOCUMENTS

| | | |
|---|---|---|
| 6,667,897 B1 * | 12/2003 | Abraham et al. ............. 365/145 |
| 6,980,468 B1 * | 12/2005 | Ounadjela ................... 365/171 |
| 2002/0089874 A1 | 7/2002 | Nickel et al. |
| 2003/0007398 A1 | 1/2003 | Daughton et al. |
| 2003/0123282 A1 | 7/2003 | Nickel et al. |
| 2003/0206434 A1 | 11/2003 | Leuschner |
| 2004/0095801 A1 | 5/2004 | Stipe |
| 2005/0002228 A1 | 1/2005 | Dieny et al. |
| 2005/0002267 A1 | 1/2005 | Daughton et al. |
| 2005/0094456 A1 * | 5/2005 | Lee et al. .................... 365/213 |

FOREIGN PATENT DOCUMENTS

| | | |
|---|---|---|
| FR | 2 832 542 | 5/2003 |
| JP | A 11-175921 | 7/1999 |
| WO | WO 00/79540 A1 | 12/2000 |
| WO | WO 03/025946 A1 | 3/2003 |
| WO | WO 03/043017 A1 | 5/2003 |
| WO | WO 03/077257 A1 | 9/2003 |
| WO | WO 03/094170 A2 | 11/2003 |
| WO | WO 2005/001490 A2 | 1/2005 |

OTHER PUBLICATIONS

Zou et al; "Growth of p- and n-type bismuth telluride thin films by co-evaporation"; Journal of Crystal Growth; vol. 222, 2001, XP004228292; pp. 82-87.

Sousa et al; "Bias current heating in spin dependent tunnel junctions"; Sep. 26, 2003; XP002280171; pp. 1-3.

EPO communication for Application 04 791 472 6, dated Sep. 5, 2008 with an English translation.

* cited by examiner

MAGNETIC TUNNEL JUNCTION DEVICE AND WRITING/READING FOR SAID DEVICE

This is a Continuation of application Ser. No. 10/572,906 filed Mar. 21, 2006, abandoned, which in turn is a national stage application of PCT/FR2004/002517 filed Oct. 6, 2004. The disclosures of the prior applications are hereby incorporated by reference herein in its entirety.

BACKGROUND OF THE INVENTION

The invention relates to a magnetic device successively comprising
a first electrode,
a magnetic tunnel Junction successively comprising a first magnetic layer forming a reference layer and having a fixed magnetization, an electrically insulating layer forming a tunnel barrier and a second magnetic layer forming a storage layer and having a reversible direction magnetization,
an intermediate layer,
and a second electrode.

STATE OF THE ART

The document FR 2832542 describes a magnetic device with a magnetic tunnel junction and methods for reading and writing using this device. As represented in FIG. 1, the tunnel Junction successively comprises a first magnetic layer forming a reference layer 1 and having a fixed magnetization 2, an electrically insulating layer forming a tunnel barrier 3 and a second magnetic layer forming a storage layer 4 and having a reversible direction magnetization 5, represented by the two-way arrow in FIG. 1. The reversible direction magnetization 5 of the storage layer 4 can be oriented with respect to the fixed magnetization 2 of the reference layer 1 so that the magnetizations are parallel or anti-parallel.

The blocking temperature of magnetization of the storage layer 4 is lower than the blocking temperature of the reference layer 1. The device also comprises a current source 6, a switch 7 and means (not shown) to apply a magnetic field to the storage layer and to thus orient the magnetization 5 of the storage layer 4 with respect to the magnetization 2 of the reference layer 1 without modifying the orientation of the magnetization 2 of the reference layer 1.

In a write phase, i.e. in a magnetization phase of the storage layer 4 by application of an external magnetic field, an electric current I is made to flow through the tunnel junction to heat the storage layer 4 above the blocking temperature of its magnetization 5.

In a read phase, the orientation of the magnetization 5 of the storage layer 4 with respect to that of the reference layer 1 is measured by means of the resistance of the magnetic tunnel junction, which depends on the orientation of the magnetization 5 of the storage layer 4 with respect to that of the reference layer 1.

During writing, a voltage of about 0.5 V is applied to the terminals of the junction, requiring a relatively high electric power. The junction can moreover be damaged by this power. The voltage applied for reading is typically 0.3 V. The tunnel junction is then also heated during reading, which increases the risk of unscheduled reading.

FIG. 2 represents the potential energy 8 of the electrons in a tunnel junction subjected to a potential difference V. The junction is formed by an electron-emitting layer and an electron-receiving layer, arranged on each side of the tunnel barrier placed at X0 and respectively having an upper Fermi level Efs and a lower Fermi level Efi. The difference of the Fermi levels is proportional to the potential difference: Efs−Efi=eV, e being the elementary charge of the electron. As illustrated by the arrow 9, an electron emitted by the emitting layer passes through the tunnel barrier, by tunnel effect, without dissipating energy. Then, when Inelastic relaxation of the electron from a higher energy Efs to a lower energy Efi takes place, the electron dissipates the energy eV in the electron-receiving layer, for example by creation of phonons 10 and/or magnons 11, which increases the temperature of the electron-receiving layer. Inelastic relaxation takes place over a characteristic length, the mean inelastic free travel λin, which length is typically about a few nanometers in the magnetic materials usually used in magnetic tunnel junctions. Heat production by the tunnel current is thus maximal in a zone with a thickness of a few nanometers, located in the receiving layer and adjacent to the tunnel barrier.

The tunnel junction described in the document FR 2832542 can also comprise an anti-ferromagnetic layer, for example made of NiMn, arranged on an opposite face to the tunnel barrier of the reference layer of the tunnel junction. Furthermore, an ant-ferromagnetic layer, for example made of FeMn or Ir20Mn80, can also be arranged on an opposite face to the tunnel barrier of the storage layer of the tunnel junction. The ant-ferromagnetic layers perform the function of preserving the magnetic orientation of the storage and reference layers. Deposition of the layers forming the tunnel junction on the anti-ferromagnetic layer and nano-structuring of the Junctions may require additional steps, for example an alignment step. In addition, the risk of a tunnel barrier short-circuit is increased.

The document WO00/79540 describes a magnetic memory formed by a stacking of thin layers. The document proposes to thermally insulate memory cells to enable a Curie temperature to be achieved with a reduced electric heating current, in particular by means of a thermal insulation layer having a sufficient electric conductivity while having a low thermal conductivity with respect to aluminium. The material of the thermal insulation layer is for example a tantalum and nitrogen compound (TaN) or tungsten (W).

However, introducing such a thermal insulation layer presents additional integration problems with the tunnel junction, i.e. an increase of the surface roughness and an increase of the etching time necessary to define the memory dot. Such a thermal insulation layer would require additional polishing and etching steps, which complicate the deposition and fabrication process of the junction.

OBJECT OF THE INVENTION

It is an object of the invention to remedy these drawbacks and, in particular, to achieve a device enabling the storage layer to be heated efficiently while minimizing the electric power necessary for this heating, so as to reduce the electric consumption of the device, and to minimize the risk of a tunnel junction short-circuit while at the same time simplifying the fabrication method.

According to the invention, this object is achieved by the appended claims and, in particular, by the fact that the intermediate layer constitutes a first thermal barrier formed by a material having a thermal conductivity lower than 5 W/m/° C.

It is a further object of the invention to provide a method for read/write of a magnetic device according to the invention,
a write phase comprising flow of an electric current, through the tunnel junction, from the second magnetic layer to the first magnetic layer, so as to heat the second magnetic layer to a higher temperature than the blocking temperature of the magnetization of the second magnetic layer, and a read phase comprising flow of an electric current, through the tunnel junction, from the first magnetic layer to the second magnetic layer.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
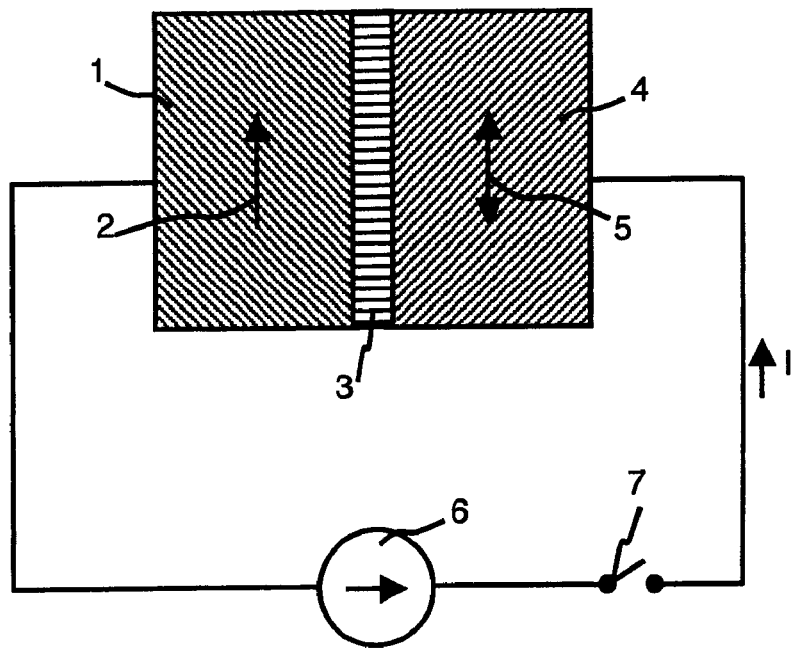
FIG. 1 represents a device comprising a magnetic tunnel junction according to the prior art.

A magnetic device according to the invention comprises first and second electrodes between which a tunnel junction such as the one represented in FIG. 1 is arranged, a thermal barrier formed by a material having a low thermal conductivity being in contact with at least one of the magnetic layers of the tunnel junction so as to concentrate the heat produced by the tunnel current in the storage layer during the write phases.

Figure 3:
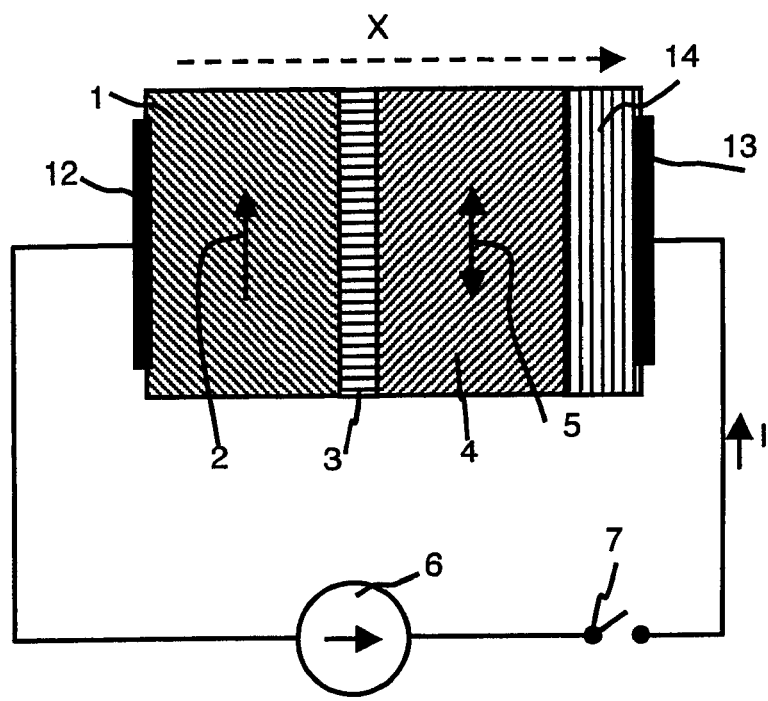
FIGS. 3 to 5 represent three particular embodiments of a magnetic device according to the invention.

In FIG. 3, the device magnetic successively comprises, along an axis X, the first electrode 12, a tunnel junction such as the one represented in FIG. 1, a first thermal barrier and the second electrode 13. The first thermal barrier is formed by an intermediate layer 14 arranged between the storage layer 4 and the second electrode 13. The electrodes 12 and 13 are at ambient temperature and enable the tunnel junction to be cooled after the write and read phases.

According to the invention, the intermediate layer 14 forming the first thermal barrier is formed by a material having a thermal conductivity of less than 5 W/m/° C. Deposition, on an intermediate layer 14, of the layers forming the tunnel junction is in fact simpler the smaller the thickness of the intermediate layer 14. In particular, the roughness of a thin layer 14 is generally lesser and the risk of short-circuit of a tunnel junction deposited on a thin layer 14 is reduced. However, for a predetermined thermal resistance, the intermediate layer 14 can present a smaller thickness the lower its thermal conductivity.

The compounds used in the prior art are not satisfactory in this respect. This is in particular the case of the tantalum and nitrogen compound (TaN) or of tungsten (W) mentioned in the above-mentioned document WO00/79540, which respectively have a thermal conductivity of about 35 W/m/° C. and of about 173 W/m/° C. This is also the case of the anti-ferromagnetic layers made of FeMn or Ir20Mn80 mentioned in the above-mentioned document FR 2832542, which respectively have a thermal conductivity of 44 W/m/° C. and 35.6 W/m/° C. The use of anti-ferromagnetic layers as thermal barrier would require a large thickness, which would make deposition of the layers forming the tunnel junction on the anti-ferromagnetic layer and nano-structuring of the junctions more difficult.

In addition, the materials having a thermal conductivity of less than 5 W/m/° C. also enable a low thermal capacitance of the thermal barrier to be obtained, which enables a very low thermal time constant to be obtained. The thermal time constant corresponds to the product (Rth.Cth) of the thermal resistance Rth of a thermal barrier and of the thermal capacitance Cth of the thermal barrier. The lower the thermal time constant, the quicker a thermal gradient can be established in a write phase.

Figure 4:
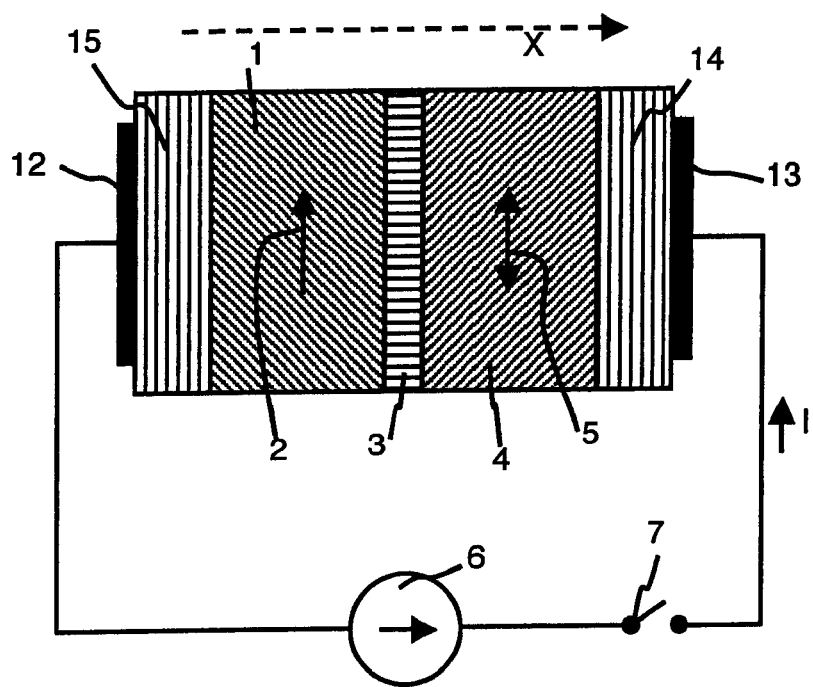

In FIG. 4, in addition to the first thermal barrier, the device comprises a second thermal barrier formed by a layer 15 arranged between the first electrode 12 and the reference layer 1.

The storage layer 4 can be formed by a single layer of magnetic material or by a multilayer, the coercive field whereof decreases rapidly when the temperature is increased, in a temperature interval comprised between 20° C. and 250° C. For example, the material of the storage layer can be a terbium (Tb) and cobalt (Co) alloy enriched with cobalt near the interface between the storage layer 4 and the tunnel barrier 3, which enables the polarization of the electrons passing through the tunnel barrier 3 to be increased. The Tb and Co alloy has a blocking temperature close to the ambient temperature. The storage layer 4 can also be formed by a repetition multilayer with a magnetization perpendicular to the plane of the layers, for example by an alternation of two layers of cobalt (Co) and platinum (Pt), respectively having a thickness of 0.5 nm and 2 nm.

Preferably, the storage layer 4 is formed by a stacking of a ferromagnetic layer and an anti-ferromagnetic layer, for example made of an iron and manganese compound, for example FeMn, or of an iridium and manganese compound comprising for example 20% Ir and 80% Mn, having a blocking temperature comprised between 130° C. and 250° C.

Preferably, the first and/or second thermal barriers have an electrical conductivity such that the electrical resistance of the thermal barrier is substantially lower than the electrical resistance of the tunnel barrier 3, preferably at least by a factor ten. The thermal barrier being connected in series with the tunnel barrier 3, the magneto-resistance signal is in fact weaker the higher the electrical resistance of the thermal barrier.

The material of the first and/or second thermal barriers preferably comprises is at least one alloy containing at least one element chosen from arsenic (As), antimony (Sb), bismuth (Bi), germanium (Ge), tin (Sn) and lead (Pb) on the one hand, and containing at least one element chosen from sulphur (S), selenium (Se), tellurium (Te), aluminium (Al), gallium (Ga), indium (In) and thallium (Tl) on the other hand. The material of the thermal barriers can thus be an alloy of bismuth (Bi) and tellurium (Te), for example BiTe or Bi2Te3, which presents a relatively good electrical conductivity of about 1.75 mΩcm for a very low thermal conductivity of about 1.5 W/m/° C. Other examples for the material of the thermal barriers are thallium, tin and tellurium alloys, for example Tl2SnTe5, thallium, bismuth and tellurium alloys, for example Tl9BiTe6, strontium (Sr), gallium and germanium alloys, for example Sr8Ga16Ge30, and strontium, europium (Eu), gallium and germanium alloys, for example Sr4Eu4Ga16Ge30. It should be noted that the bismuth and tellurium alloy forms part of the thermoelectric materials that often present a very low thermal conductivity.

The material of the thermal barriers can also be a phase change material, able to present a crystalline phase and an amorphous phase at ambient temperature. Typically, the amorphous state presents a high electrical resistivity, whereas the crystalline state presents a low electrical resistivity. For a phase change material to be used for the first and/or second thermal barriers, the material must be in its crystalline state. The thermal conductivity of phase change materials is typically less than 5 W/m/° C., in the amorphous state and in the crystalline state. For example, the germanium, antimony and tellurium alloy Ge2Sb2Te5 and the alloy Sb2Te3 respectively have thermal conductivities of about 0.3 W/m/° C. and about 12 W/m/° C. To obtain a layer in a crystalline state, thermal treatment generally has to be performed. The thermal treatment is advantageously performed before deposition of the layers forming the tunnel junction.

The material of the first and/or second thermal barriers can also be a material comprising at least one alloy containing at least one element chosen from phosphorus (P), arsenic (As) and antimony (Sb) and containing at least one element chosen from iron (Fe), ruthenium (Ru), osmium (Os), cobalt (Co), rhodium (Rh), iridium (Ir) and zinc (Zn), such as for example the alloys Zn4Sb3 and CoFe4Sb12. Furthermore, the material of the first and/or second thermal barriers can contain at least one element chosen from lanthanum (La), cerium (Ce), praseodymium (Pr), neodymium (Nd), samarium (Sm), europium (Eu), gadolinium (Gd), thulium (Tm), ytterbium (Yb), thorium (Th) and uranium (U), such as for example the alloys Yb0.2Co4Sb12, LaThFe3CoSb12, EuCo4Sb12 and EuCoSb12Ge0.5.

Figure 5:
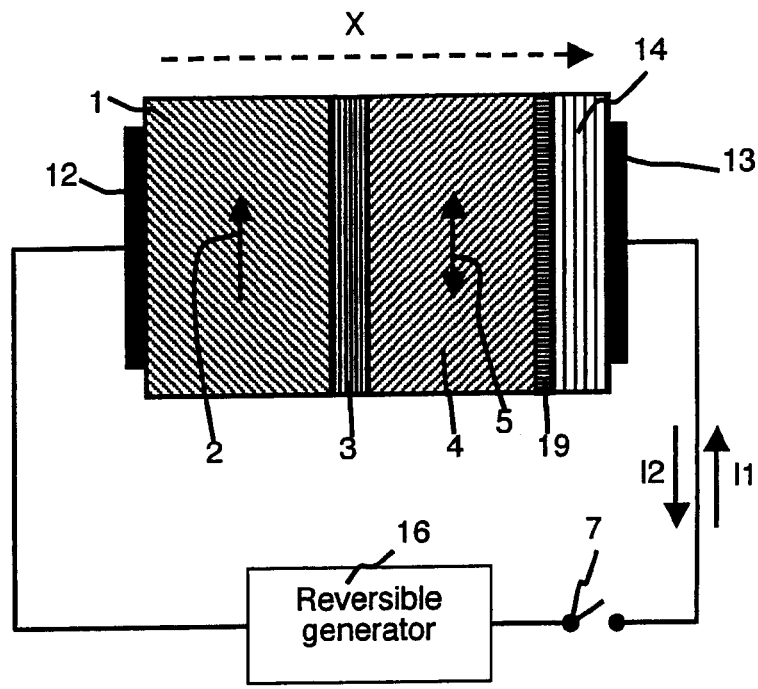

When the first thermal barrier is formed by a magnetic layer, for example an anti-ferromagnetic layer, a magnetic decoupling layer 19 can be arranged between the first thermal barrier, formed by the layer 14, and the storage layer 4, as represented in FIG. 5, in order to decouple the magnetic thermal barrier from the storage layer 4. The material of the magnetic decoupling layer 19 can be a non-magnetic material chosen from tantalum, chromium, vanadium, manganese and platinum. In the case of an anti-ferromagnetic second thermal barrier, a magnetic decoupling between the second thermal barrier and the reference layer is not necessary, as the magnetization of the reference layer is trapped.

In the particular embodiment represented in FIG. 5, a third thermal barrier is formed by the tunnel barrier 3 itself. For example, the tunnel barrier can be made of silicon oxide ($SiO_2$), zirconium oxide ($ZrO_2$) or titanium oxide ($TiO_2$). The thermal conductivities of zirconium oxide and titanium oxide are respectively 1.5 W/m/° C. and 7.4 W/m/° C.

Figure 6:
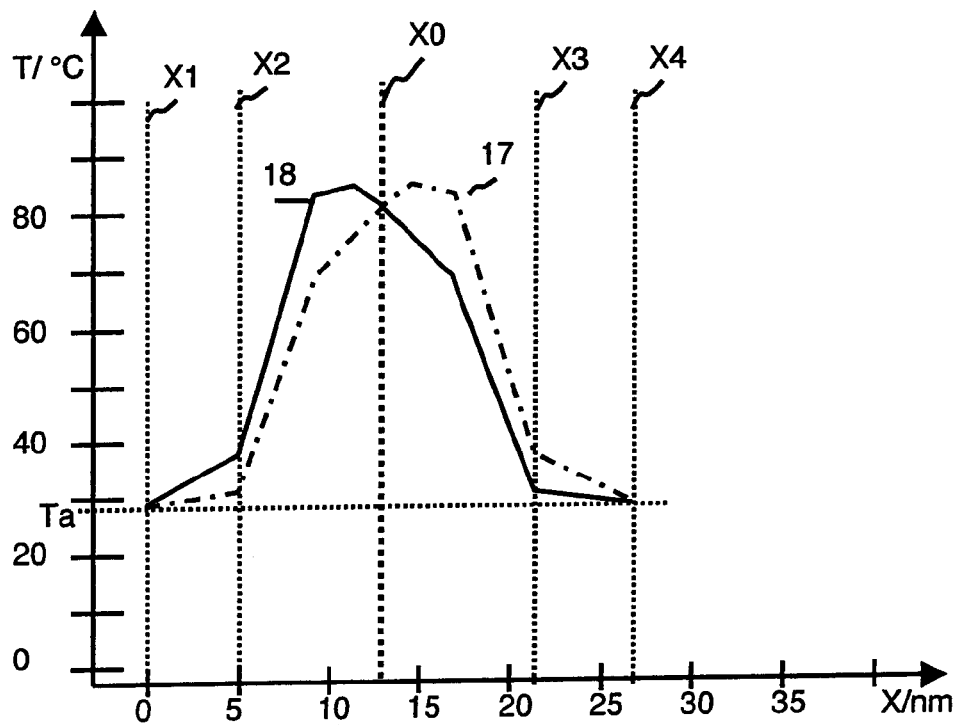
FIG. 6 represents two theoretical temperature distributions in a magnetic tunnel junction, respectively for a current flowing from the storage layer to the reference layer and in the opposite direction.

The temperature variation in a device according to the prior art was studied. Thus, FIG. 6 represents two theoretical temperature distributions in a magnetic device comprising a magnetic tunnel junction according to the prior art, respectively for a current flowing from the storage layer 4 to the reference layer 1 (curve 17) and in the opposite direction (curve 18). To bring out the symmetry of the temperature profile generated by the flow of the current, the structure of this example was deliberately chosen symmetrical. The device successively comprises, along the axis X, between the first electrode 12 and the second electrode 13:

- a layer of tantalum (Ta) with a thickness of 5 nm arranged in the gap comprised between X1 and X2 in FIG. 6,
- a stacking of a 5 nm layer of IrMn and a 3 nm layer of NiFe forming the reference layer 1 (X2-X0),
- a 0.6 nm layer of alumina forming the tunnel barrier 3, represented, on account of its thinness, by the dotted line arranged at X0,
- a stacking of a 3 nm layer of NiFe and a 5 nm layer of IrMn forming the storage layer 4 (X0-X3)
- and a layer of Ta with a thickness of 5 nm (X3-X4).

The device is then symmetrical with respect to the coordinate X0 and does not comprise a thermal barrier. The curves 17 and 18 are obtained for a tunnel junction connected at these terminals to two copper electrodes kept at ambient temperature and having a potential difference of 0.5V.

Figure 2:
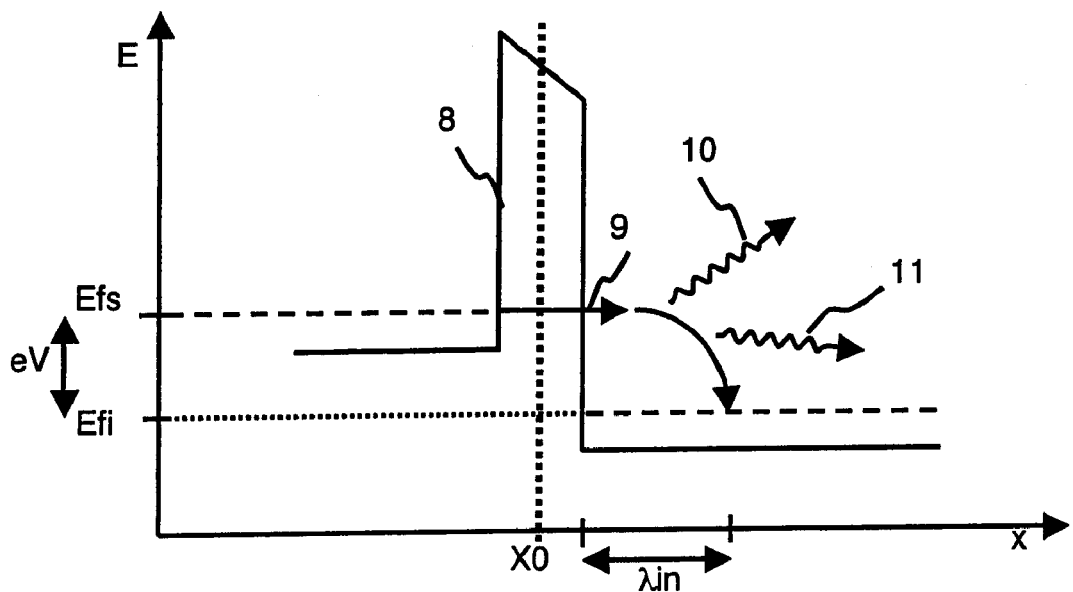
FIG. 2 represents the energy variations of the electrons in a tunnel junction according to the prior art, subjected to a potential difference.

An asymmetry of the temperature distributions 17 and 18 can be observed in FIG. 6. A current flowing from the storage layer 4 to the reference layer 1 (curve 17) in fact corresponds to a movement of electrons from the reference layer 1 to the storage layer 4 (to the right in the figure), which implies a dissipation of their energy in the storage layer 4 ((X0-X3), i.e. in a zone located to the right of the tunnel barrier (X0), as represented in FIG. 2. This is illustrated by the amplitude of the curve 17, which is greater for values of X higher than X0 than for values lower than X0. The curve 18 corresponds to a movement of electrons flowing from right to left in the FIG. 6 and thus creating more heat for values lower than X0.

Thus, for a given current, the current direction enables the magnetic layer 1 or 4 that is heating most to be defined in the junction. In this way, a read/write method of a magnetic device according to the invention can be performed. A write phase comprises flow of an electric current I1 (FIG. 5), through the tunnel junction, from the storage layer 4 to the reference layer 1, so as to heat the storage layer 4 to a higher temperature than the blocking temperature of the magnetization 5 of the storage layer 4, whereas a read phase comprises flow of an electric current I2 (FIG. 5), through the tunnel junction, in the opposite direction, i.e. from the reference layer 1 to the storage layer 4. The storage layer 4 is thus efficiently heated during the write phases, whereas heating of the storage layer 4 during the read phases is decreased. The currents I1 and I2 can for example be generated by a reversible generator 16.

Figure 7:
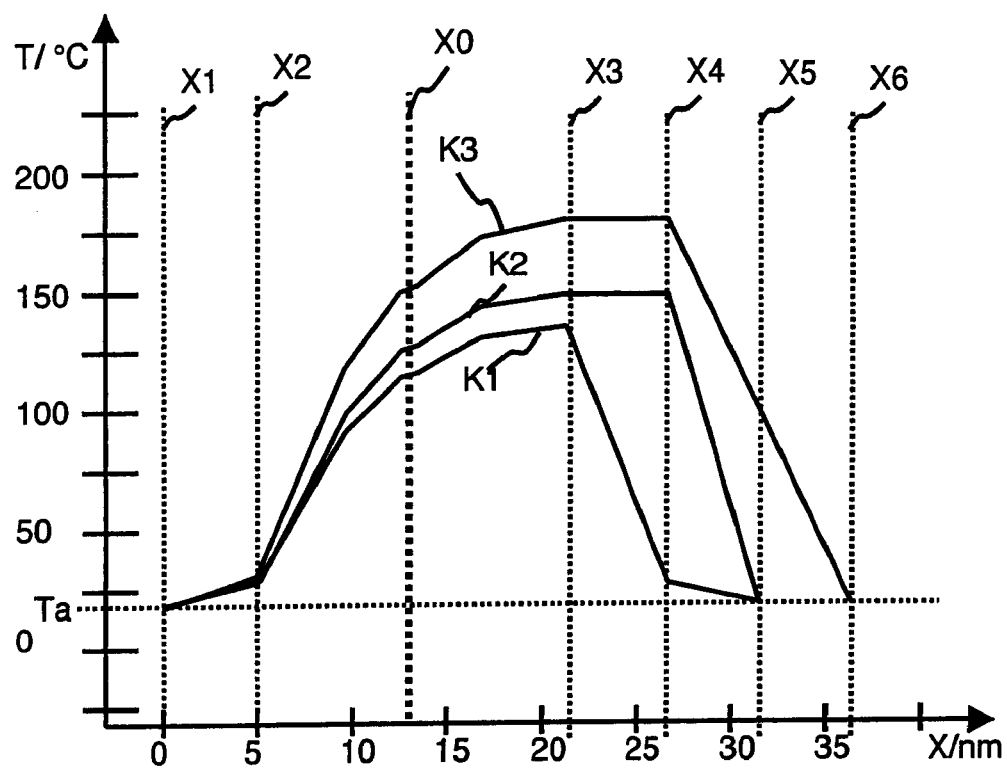
FIGS. 7 to 9 represent different theoretical temperature distributions and correspond respectively to the embodiments represented in FIGS. 3, 4 and 5.
Figure 8:
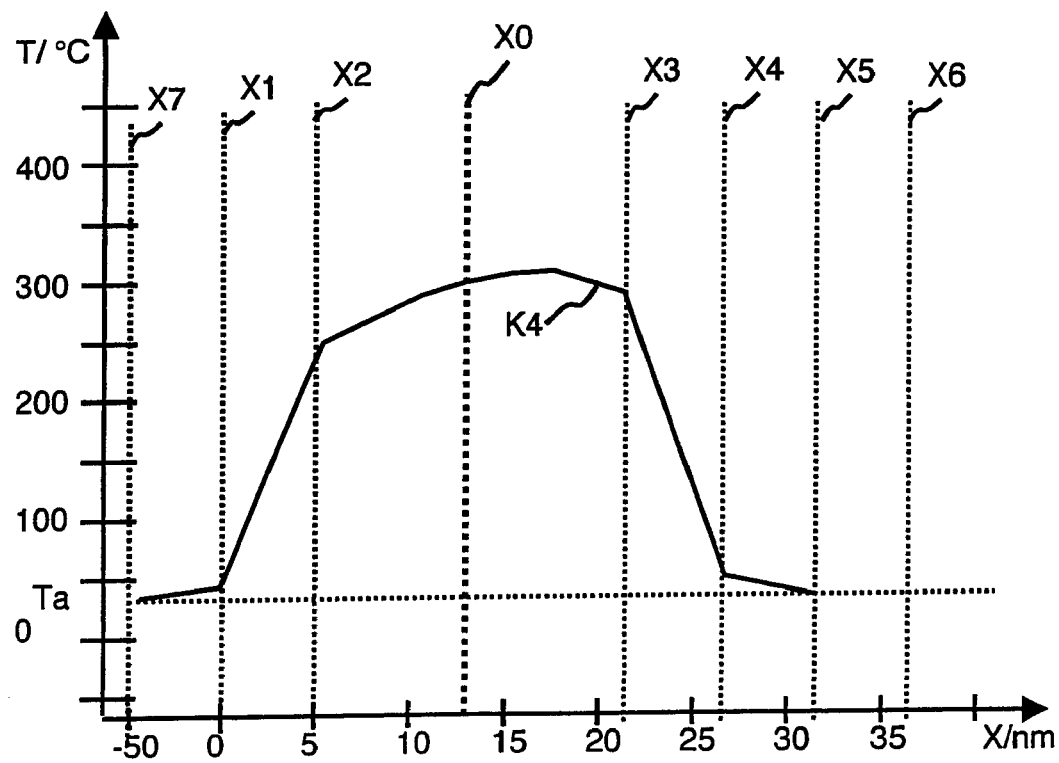
Figure 9:
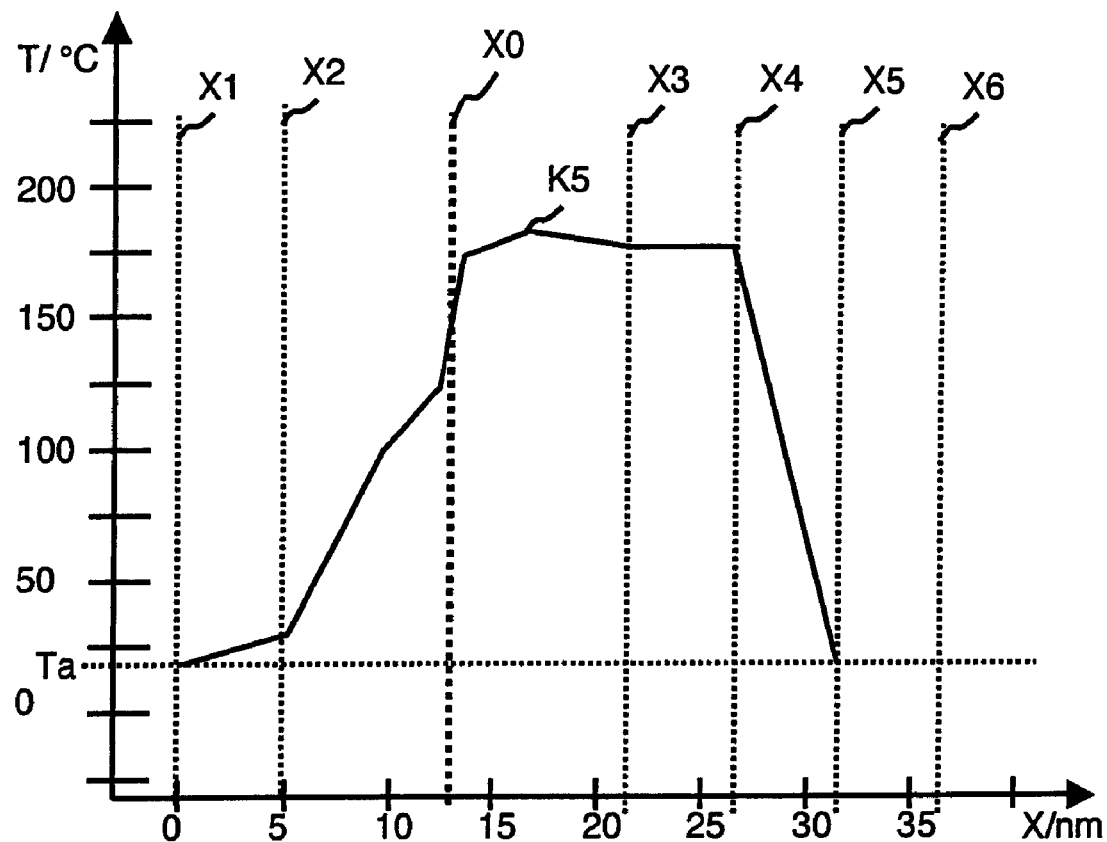

The temperature variation in a device according to the invention is illustrated in FIGS. 7 to 9. The theoretical temperature distributions (curves K1 to K5) represented in FIGS. 7 to 9 are obtained for an electric current direction from the storage layer 4 to the reference layer 1, i.e. for a movement of the electrons from the reference layer 1 to the storage layer 4, and thus correspond to the write phases.

The curves K1 to K5, and the curves 17 and 18, illustrate the temperature distribution at the end of a current pulse with a duration of 500 ps and an intensity of 250 mA/$\mu m^2$, corresponding to a product of the resistance R of the tunnel junction and of the surface S of the tunnel Junction RS=2 $\Omega m^2$. During the duration of the pulse, the temperature of the junction increases rapidly to reach a permanent regime corresponding to the maximum temperature. Then, when the current is annulled, the temperature drops back rapidly to the ambient temperature by heat diffusion to the external electrodes 12 and 13 which act as thermostats.

The three curves K1, K2 and K3 represented in FIG. 7 illustrate the variation of the temperature distributions in magnetic devices according to FIG. 3 comprising different layers 14. Said magnetic devices also each comprise a layer of tantalum arranged in the gap comprised between X1 and X2 in FIG. 7 (not shown in FIG. 3).

Thus, the layer 14 of the magnetic device for the curve K1 is formed by a stacking of a layer of BiTe with a thickness of 5 nm (X3-X4) and of a layer of Ta with a thickness of 5 nm (X4-X5), successively arranged between the storage layer 4 and the second electrode 13.

The layer 14 for the curve K2 is formed by a stacking of a layer of Ta with a thickness of 5 nm (X3-X4) and of a layer of BiTe with a thickness of 5 nm (X4-X5), successively arranged between the storage layer 4 and the second electrode 13.

The layer 14 corresponding to the curve K3 is formed by a stacking of a layer of Ta with a thickness of 5 nm (X3-X4) and of a layer of BiTe with a thickness of 10 nm (X4-X6), successively arranged between the storage layer 4 and the second electrode 13.

The use of thermal barriers does in fact enable temperatures comprised between 100° C. and 175° C. to be reached in the layer magnetic (X0-X3), which temperatures are therefore higher than the temperatures obtained in a device according to the prior art (FIG. 6, curve 17, always substantially lower than 100° C.). The efficiency of the thermal barrier is all the better the larger its thickness. Indeed, curve K3 is greater than curve K2. However, the thickness of the thermal barrier limits the temperature decrease kinetics once the current has been annulled.

Moreover, to reduce the electric consumption necessary for heating, the storage layer 4 preferably has a small thickness, for example about 8 nm.

The temperature distributions represented by the curves K1 to K3 are obtained for an alumina tunnel barrier 3. As alumina is a good heat conductor, the heat produced in the storage layer 4 is removed passing through the tunnel barrier 3 and the reference layer 1 to the first electrode 12. To limit this heat loss which is detrimental to the efficiency of heating, it is then advantageous to insert the second thermal barrier, represented in FIG. 4, to confine the heat in the storage layer 4 as far as possible.

The curve K4 represented in FIG. 8 illustrates the temperature distribution of a device comprising a first and a second thermal barrier respectively formed by a layer 14 and a layer 15. The layer 15 is formed by a stacking of a 5 nm layer of Ta (X7–X1) and of a 5 nm layer of BiTe (X1-X2), successively arranged between the first electrode 12 and the reference layer 1. The layer 14 is identical to the layer 14 corresponding to the curve K1. The temperature in the storage layer 4 (X0-X3) is about 300° C., which is therefore higher than in the case of use of a first thermal barrier only (curve K1).

FIG. 9 illustrates the temperature distribution (curve K5) obtained for a device comprising a third thermal barrier formed by the tunnel barrier 3 itself and a first thermal barrier formed by the layer 14. The tunnel barrier 3 is formed by a silica layer with a thickness of 0.6 nm. The layer 14 and reference layer 1 are respectively Identical to those corresponding to the curve K2. The temperature in the storage layer 4 (X0-X3) is about 175° C. (curve K5), therefore higher than the temperature of a device having an alumina tunnel barrier 3 (curve K2) whose temperature does not exceed 150° C. Indeed, silica has a lower thermal conductivity (1.5 W/m/° C.) than alumina (36.7 W/m/° C.) and thus enables heat to be confined more efficiently In the storage layer 4.

The invention is not limited to the embodiments represented. In particular, any combination of the first, second and third thermal barriers is possible.

What is claimed is:

1. A magnetic device comprising in succession a first electrode, a magnetic tunnel junction comprising in succession a first magnetic layer forming a reference layer and having a fixed magnetization, an electrically insulating layer forming a tunnel barrier and a second magnetic layer forming a storage layer and having a reversible direction magnetization, an intermediate layer, and a second electrode, wherein the intermediate layer is nonmagnetic and constitutes a first thermal barrier comprising a material having a thermal conductivity lower than 5 W/m/° C.

2. The magnetic device according to claim 1, further comprising a second thermal barrier comprising a layer arranged between the first electrode and the first magnetic layer.

3. The magnetic device according to claim 2, wherein the tunnel barrier comprises a third thermal barrier.

4. The magnetic device according to claim 3, wherein the material of the tunnel barrier is chosen from silicon oxide, zirconium oxide and titanium oxide.

5. The magnetic device according to claim 2, wherein the material of one of the thermal barriers has an electrical conductivity such that the electrical resistance of the one thermal barrier is substantially lower than the electrical resistance of the tunnel barrier.

6. The magnetic device according to claim 2, wherein the material of the second thermal barrier has an electrical conductivity such that the electrical resistance of the thermal barrier is substantially lower than the electrical resistance of the tunnel barrier.

7. The magnetic device according to claim 2, wherein the material of the second thermal barrier comprises at least one alloy containing at least one element chosen from arsenic, antimony, bismuth, germanium, tin and lead and containing at least one element chosen from sulfur, selenium, tellurium, aluminum, gallium, indium and thallium.

8. The magnetic device according to claim 2, wherein the material of the second thermal barrier comprises at least one alloy containing at least one element chosen from arsenic, antimony, bismuth, germanium, tin and lead and containing at least one element chosen from sulfur, selenium, tellurium, aluminum, gallium, indium and thallium.

9. The magnetic device according to claim 2, wherein the material of the second thermal barrier comprises at least one alloy containing at least one element chosen from phosphorus, arsenic and antimony and containing at least one element chosen from iron, ruthenium, osmium, cobalt, rhodium, iridium and zinc.

10. The magnetic device according to claim 2, wherein the material of the second thermal barrier comprises at least one element chosen from lanthanum, cerium, praseodymium, neodymium, samarium, europium, gadolinium, thulium, ytterbium, thorium and uranium.

11. The magnetic device according to claim 10, wherein the material of the first thermal barrier comprises at least one element chosen from lanthanum, cerium, praseodymium, neodymium, samarium, europium, gadolinium, thulium, ytterbium, thorium and uranium.

12. The magnetic device according to claim 2, wherein the thickness of the intermediate layer is between about 5 nm and 10 nm.

13. The magnetic device according to claim 2, wherein the thickness of the intermediate layer is about 8 nm.

14. The magnetic device according to claim 1, wherein the material of the first thermal barrier has an electrical conductivity such that the electrical resistance of the thermal barrier is substantially lower than the electrical resistance of the tunnel barrier.

15. The magnetic device according to claim 1, wherein the material of the first thermal barrier comprises at least one alloy containing at least one element chosen from arsenic, antimony, bismuth, germanium, tin and lead and containing at least one element chosen from sulfur, selenium, tellurium, aluminum, gallium, indium and thallium.

16. The magnetic device according to claim 1, wherein the material of the first thermal barrier comprises at least one alloy containing at least one element chosen from phosphorus, arsenic and antimony and containing at least one element chosen from iron, ruthenium, osmium, cobalt, rhodium, iridium and zinc.

17. The magnetic device according to claim 16, wherein the material of the first thermal barrier comprises at least one element chosen from lanthanum, cerium, praseodymium, neodymium, samarium, europium, gadolinium, thulium, ytterbium, thorium and uranium.

18. A read/write method of a magnetic device according to claim 1, wherein a write phase comprises flow of an electric current, through the tunnel junction, from the second magnetic layer to the first magnetic layer, so as to heat the second magnetic layer to a higher temperature than the blocking temperature of the magnetization of the second magnetic layer, and a read phase comprises flow of an electric current, through the tunnel junction, from the first magnetic layer to the second magnetic layer.

19. The magnetic device according to claim 1, wherein the intermediate layer is in contact with the second magnetic layer.

20. The magnetic device according to claim 1, wherein the magnetic device comprises a single magnetic tunnel junction.

21. The magnetic device according to claim 1, wherein the non-magnetic intermediate layer comprises BiTe.

22. A magnetic device comprising in succession a first electrode, a magnetic tunnel junction comprising in succession a first magnetic layer forming a reference layer and having a fixed magnetization, an electrically insulating layer forming a tunnel barrier and a second magnetic layer forming a storage layer and having a reversible direction magnetization, an intermediate layer, and a second electrode, wherein the intermediate layer constitutes a first thermal barrier comprising a material having a thermal conductivity lower than 5 W/m/° C., and wherein the first thermal barrier comprises an anti-ferromagnetic layer, and a magnetically decoupling layer between the first thermal barrier and the second magnetic layer.

23. The magnetic device according to claim 22, wherein the material of the magnetic decoupling layer is chosen from tantalum, chromium, vanadium, manganese and platinum.

24. A magnetic device comprising in succession:
a first electrode;
a magnetic tunnel junction, the magnetic tunnel junction comprising in succession a first magnetic layer forming a reference layer and having a fixed magnetization, an electrically insulating layer forming a tunnel barrier and a second magnetic layer forming a storage layer and having a reversible direction magnetization;
an intermediate layer, wherein the intermediate layer comprises a nonmagnetic layer or a magnetically decoupled layer associated with an antiferromagnetic layer, and constitutes a thermal barrier formed by a material having a thermal conductivity lower than the thermal conductivity of each of the layers in the magnetic tunnel junction; and
a second electrode.

* * * * *

UNITED STATES PATENT AND TRADEMARK OFFICE
CERTIFICATE OF CORRECTION

PATENT NO. : 7,480,175 B2
APPLICATION NO. : 11/780402
DATED : January 20, 2009
INVENTOR(S) : Dieny et al.

It is certified that error appears in the above-identified patent and that said Letters Patent is hereby corrected as shown below:

<u>On the Title Page:</u>

Item (75), after "Lans" delete "en" and substitute --En-- in its place.

Item (73), delete "a l'Energie" and substitute -- A L'Energie-- in its place.

Item (56) Foreign Pat. Docs
Page 2, column 2, line 1, delete "WO 00/79540" and substitute
--WO 00/79540.40-- in its place.

<u>In the Claims:</u>

Column 8, claim 2, line 1, immediately after "claim 1" delete ",".

Column 8, claim 8, line 25, delete the entire claim 8. Claim 8 is a duplicate of Claim 7.

Signed and Sealed this

Eighth Day of December, 2009

David J. Kappos
*Director of the United States Patent and Trademark Office*